United States Patent
Tobin

(10) Patent No.: US 6,727,682 B1
(45) Date of Patent: Apr. 27, 2004

(54) APPARATUS AND METHOD FOR REMOTE CURRENT SENSING

(75) Inventor: Noel Patrick Tobin, County Dublin (IE)

(73) Assignee: Suparules Limited, Castletroy (IE)

(*) Notice: Subject to any disclaimer, the term of this patent is extended or adjusted under 35 U.S.C. 154(b) by 0 days.

(21) Appl. No.: 09/831,544

(22) PCT Filed: Nov. 12, 1999

(86) PCT No.: PCT/EP00/00114

§ 371 (c)(1),
(2), (4) Date: Oct. 22, 2001

(87) PCT Pub. No.: WO00/29858

PCT Pub. Date: May 25, 2000

(51) Int. Cl.[7] .............................................. G01R 33/00
(52) U.S. Cl. .......................... 324/117 R; 324/117 H; 324/126
(58) Field of Search ..................... 324/117 R, 117 H, 324/126, 127, 142; 340/870.2

(56) References Cited

U.S. PATENT DOCUMENTS

| | | | |
|---|---|---|---|
| 4,799,005 A | * | 1/1989 | Fernandes .................. 324/127 |
| 5,159,561 A | | 10/1992 | Watanabe et al. |
| 5,250,894 A | * | 10/1993 | Bridges et al. ......... 324/117 H |
| 5,652,506 A | | 7/1997 | Sorenson et al. |
| 5,652,507 A | * | 7/1997 | Blakely ...................... 324/127 |
| 6,040,690 A | | 3/2000 | Ladds |
| 6,323,634 B1 | * | 11/2001 | Nakagawa et al. ..... 324/117 R |
| 6,366,076 B1 | * | 4/2002 | Karrer et al. ........... 324/117 R |

OTHER PUBLICATIONS

International Search Report for International Patent Application No. PCT/IE99/00114 Date of Completion of Search: Feb. 15, 2000.

* cited by examiner

*Primary Examiner*—Kamand Cuneo
*Assistant Examiner*—Tung X. Nguyen
(74) *Attorney, Agent, or Firm*—Van Dyke, Gardner, Linn & Burkhart, LLP

(57) ABSTRACT

An apparatus for remotely sensing the currents flowing in a set of substantially parallel conductors carrying N independent AC currents comprises N magnetic field sensors M1, M2 positioned to take mutually independent measurements of the magnetic field generated by the conductors and provide corresponding signals. Processing means 12' or 12" derive further signals, respectively corresponding to the conductor currents, based upon the sensor signals and the location and angular orientation of each sensor relative to each conductor.

15 Claims, 9 Drawing Sheets

US 6,727,682 B1

APPARATUS AND METHOD FOR REMOTE CURRENT SENSING

BACKGROUND OF THE INVENTION

This invention relates to an apparatus and method for remotely sensing the alternating currants (AC) in a set of substantially parallel conductors from the magnetic fields generated by these currents in the vicinity of the conductors.

This invention relates to an apparatus and method for remotely sensing the alternating currents (AC) in a set of substantially parallel conductors from the magnetic fields generated by these currents in the vicinity of the conductors.

SUMMARY OF THE INVENTION

According to the present invention there is provided an apparatus for remotely sensing the currents flowing in a se of substantially parallel conductors carrying N independent AC crrents, the apparatus comprising N magnetic field sensors positioned to take mutually independent measurements of the magnetic field generated by the conductors and provide corresponding signals, and processing fews for deriving further signals, respectively corresponding to the conductor currents, based upon the sensor signals and the location and angular orientation of each sensor relative to each conductor.

Preferably, in the case where the further signals include harmonic components of the fundamental frequency of the conductor currents, the processing means includes means for deriving the harmonic components of the further signals, adjusting the amplitudes of the harmonic components to reduce any distortion produced by said harmonic components in the sensors, and recombining the adjusted frequency components with the fundamental frequency components to produce said further signals with reduced distortion.

Preferably the means for deriving harmonic frequency components of the sensor signals comprises fourier analysis means.

By "positioned to take mutually independent measurements" we mean that none of the sensors provides data which is substantially the same as or simply a linear combination of the data provided by the other(s). In practice this means that no two sensors have axes with the same angular orientation relative to the conductors and are in proximity when right projected onto a plane perpendicular to the conductors.

In this connection it is to be understood that the axis of a magnetic sensor is that direction relative to the sensor which, when orientated parallel to the lines of force of a fluctuating magnetic field passing through the sensor, would provide the maximum induced signal in the sensor for that magnetic field, and the plane of the sensor is a plane passing through the sensor normal to its axis.

Preferably the plane of each sensor is substantially parallel to the conductors.

The sensors are preferably coils, the plane of the coil being the plane through the geometric centre of the coil parallel to the turns of the coil and the axis of the coil being the direction through the coil centre normal to such plane.

The invention further provides a method for remotely sensing the currents flowing in a set of substantially parallel conductors carrying N independent AC currents, the method comprising positioning N magnetic field sensors to take mutually independent measurements of the magnetic field generated by the conductors and provide corresponding signals, and deriving further signals, respectively corresponding to the conductor currents, based upon the sensor signals and the location and angular orientation of each sensor relative to each conductor.

BRIEF DESCRIPTION OF THE DRAWINGS

Embodiments of the invention will now be described, by way of example, with reference to the accompanying drawings, in which.

DETAILED DESCRIPTION OF THE PREFERRED EMBODIMENT

Referring to FIGS. 1 to 6 of the drawings, an apparatus for measuring the currents in the case of a two track AC rail traction system includes an instrument 10 and an associated PC 12' or 12". The instrument 10 comprises an enclosure or housing 14 containing two magnetic field sensors M1 and M2. In this embodiment the sensors are coils. The instrument 10 is mounted on a catenary support (not shown) of the AC rail traction system or may be mounted on a post next to the AC rail traction system.

Figure 1:
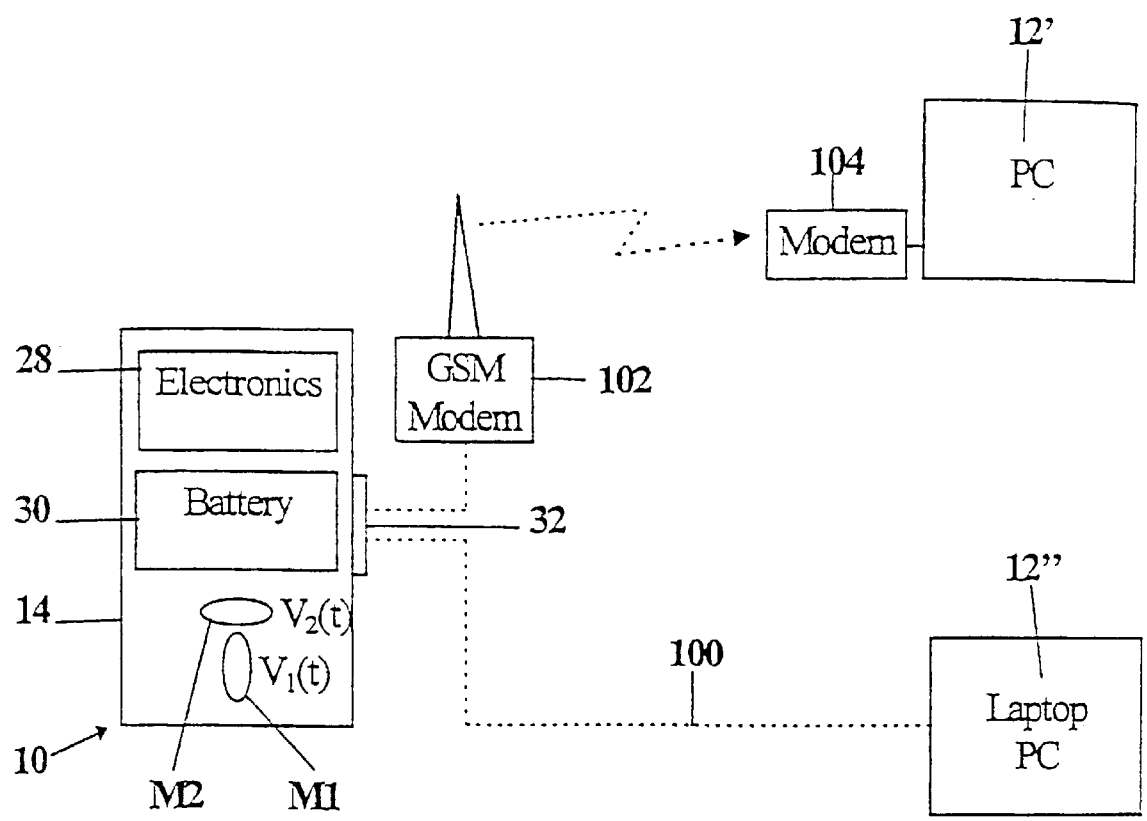
FIG. 1 is a schematic view of an apparatus according to a first embodiment of the invention for measuring the currents in an AC rail traction system with two overhead catenaries and return currents in the rails.
Figure 2:
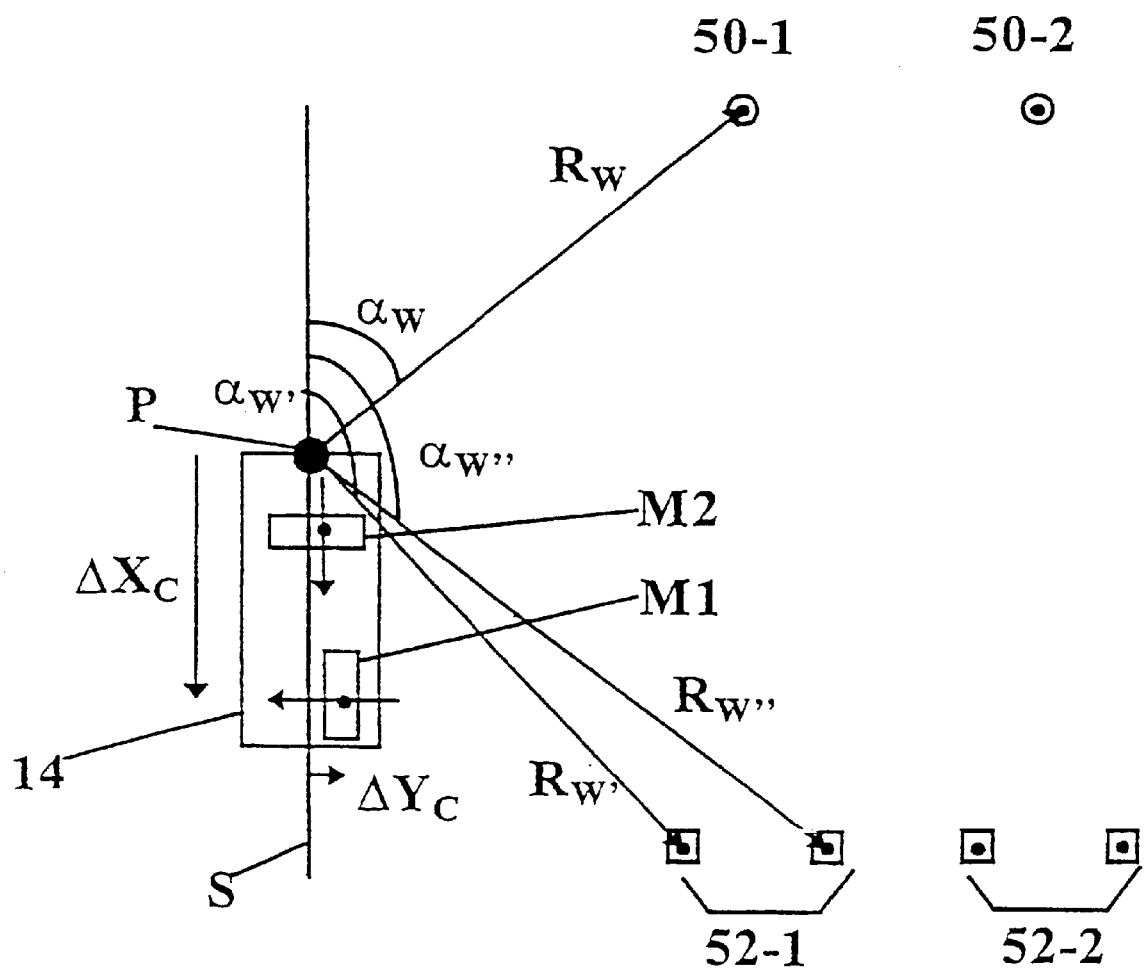
FIG. 2 is a diagram illustrating the geometric parameters which are measured with respect to the apparatus of FIG. 1 and used in the calculations according to Appendix 1.

As seen in FIG. 2, in the present embodiment the traction system comprises two overhead substantially parallel catenaries 50-1, 50-2 each associated with a respective pair of parallel rails 52-1, 52-2. Each catenary together with its respective pair of rails constitutes a current loop with primary current in the catenary and return current in the rails. Since the currents in the two catenaries 50-1, 50-2 are independent, two sensing coils, i.e. the coils M1 and M2, positioned to take mutually independent measurements are necessary in the present embodiment. However, the invention is applicable to parallel conductor AC systems having any number N of independent currents, in which case the corresponding number N of magnetic field sensors, positioned to take mutually independent measurements, is used. This generalisation of the invention is given in Appendix 1.

Figure 5:
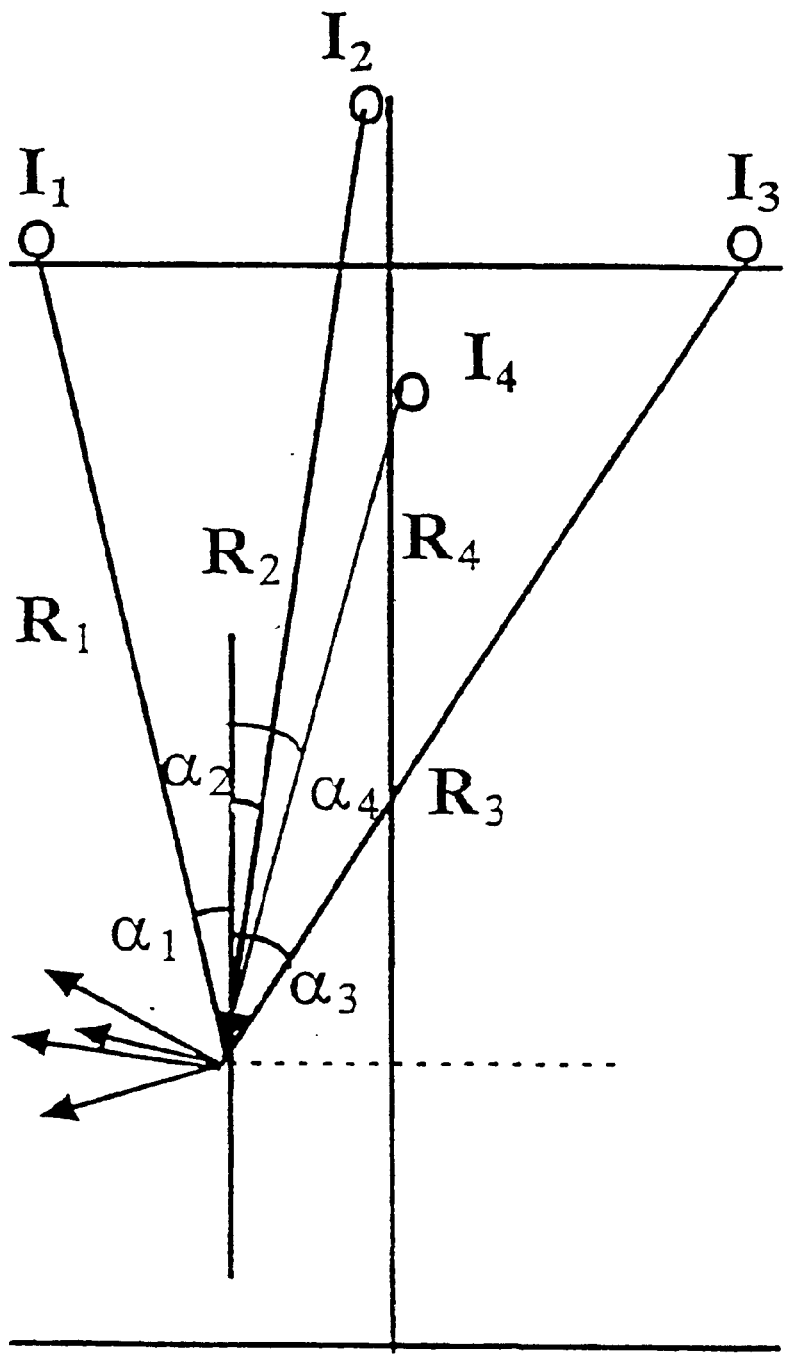
FIG. 5 is a diagram illustrating the geometric parameters which are measured with respect to the remote sensing of the currents in the case of an overhead power line.

Naturally the invention is not limited to the sensing of currents in AC traction systems, and the application of the invention generally to overhead power lines and specifically to, for example, a 3 phase overhead power line with up to 4 wires (conductors), which requires three magnetic field sensors, is also given in Appendix 1 with reference to FIG. 5.

Referring again to FIG. 2, the instrument 10 has a reference point P and a notional, but known, reference plane S passing through the point P. The instrument 10 is fixed such that the reference plane S is substantially parallel to the catenaries 50-1, 50-2 and rails 52-1, 52-2 (hereinafter all referred to as conductors). In practice the reference plane S is approximately vertical, as shown, but this is not necessary. The coils M1 and M2 are arranged within the housing 14 such that the plane of each coil is also substantially parallel to the conductors.

Within the housing 14 the location of each coil M1 and M2 relative to the reference point P is known (it is determined during manufacture). Each coil location is given by $\Delta X_c$ and $\Delta Y_c$ (FIG. 2) which are the offsets of the centre of the respective coil M1 or M2 from the instrument reference point P, the $\Delta Y$ value being measured parallel to the instrument reference plane S and the $\Delta X$ value being measured perpendicular to the instrument reference plane S. These are measured positive in the conventional sense, i.e. positive to the right and up from the reference point. The angular orientation $\theta_c$ of each coil relative to the reference plane S is also known, $\theta_c$ being the angle between the plane of the coil M1 or M2 and the instrument reference plane S. These angles are measured positive in the counter clockwise direction from the reference plane.

In the general case where N independent currents are to be sensed the N sensing coils are placed and oriented to obtain independent measures of the magnetic field in the vicinity of the conductors. To achieve this the coil orientation angles are varied typically through 90° to obtain different magnetic field measures near the same location. Coils are then displaced to a sufficiently different location to obtain additional differentiation between the readings. Such displacement would be tailored to specific applications depending on the arrangement of the external conductors, the desired sensitivity and the desired compactness of the instrument. For ease of data analysis the coils can be oriented with their planes parallel and perpendicular to the instrument reference plane, i.e. at orientation angles $\theta_c$ of 0° and 90°. However, they can be oriented at any arbitrary orientation angle $\theta_c$ as desired provided their planes are substantially parallel to the conductors. The key point is that all coils are accurately oriented, or their orientation is accurately measured, and that their location is accurately known, preferably to a precision of at least 1 mm. In the present embodiment the two coils M1 and M2 are orientated respectively parallel and perpendicular to the reference plane. The coils can be separated in the direction parallel to the conductors to avoid mutual interference.

When the housing 14 is fixed in position as aforesaid, it is necessary to know the respective radial distance $R_w$ of each conductor from the reference point P, and also the respective angular displacement $\alpha_w$ of each conductor from the reference plane S. This is most preferably achieved by providing the instrument 10 with a docking station in which an ultrasonic measuring device can be installed to measure the radial distances to the conductors and rotating this to measure the angles. These angles are measured positive in the counter clockwise direction from the reference plane.

When all these values are known, it will be appreciated that one has a precise knowledge of the location and angular orientation of each coil M1, M2 relative to each conductor.

In use a respective instantaneous voltage $V_c$ (t) will be induced in each coil M1, M2 which is proportional to the instantaneous value of the magnetic field at the respective coil. In the case of coil, sensors the induced voltage will also be proportional to the frequency of individual components or harmonics in the magnetic field. The coils can be wound on ferrite cores to improve sensitivity provided this does not cause mutual distortion between the two coils if they are in close proximity.

The enclosure 14 contains electronics 28 powered by a battery 30, and has a standard RS232 interface 32 for communication over a direct cable connection 100 with the serial port of a PC 12", for example a laptop PC, or over a communications link such as a modem or GSM module 102 to a PC 12' via a modem 104 at the PC. It is to be understood that the PCs 12' and 12" illustrate two different ways of connecting a PC to the instrument 10, and in general only one such PC will be used at any given time. The port 32 is programmable for a range of Baud rates (1,200–33,000 bps), and implements appropriate flow control and error checking.

The instrument 10 is capable of communicating with a host program 106 (FIG. 4) in the PC 12' or 12" to download data to the PC on request. It is also capable of receiving from the PC user selectable parameters such as the integration time intervals, to be described, of having the instrument clock checked or reset, of indicating the time span over which data has been logged, etc.

The host program 106 in turn is capable of communicating with the instrument 10 for assessing the status of the instrument and its data content. It is capable of initiating a download of the data from the instrument and of controlling the data flow. It is capable of receiving and processing geometric data (to be described) for the site in question. It is capable of converting the raw instrument data to current values as necessary. It is capable of archiving all the data for a site in a database entry for that site. It is capable of retrieving, displaying and graphing data for a site as required.

Figure 3:
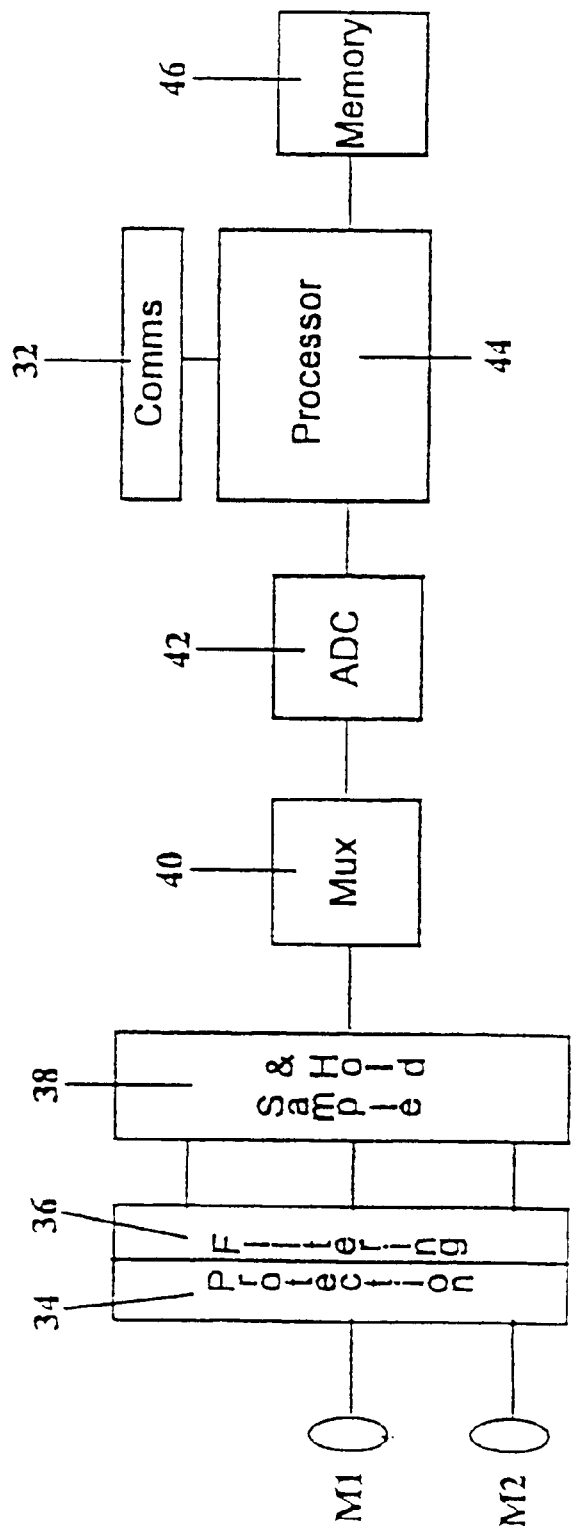
FIG. 3 is a block diagram of the electronic circuitry within the instrument of FIG. 1.

FIG. 3 is a block diagram of the electronics 28. The voltages from the coils M1, M2 are first clamped in protection circuits 34 to provide over-voltage protection, to avoid damaging the instrument electronics in the event of a disturbance. They are protected against the equivalent of a fault current of 20,000 amps. The instrument does not have to measure such currents. It is only necessary to avoid being damaged by them.

The voltages from the coils are then filtered as appropriate by filters 36 to pass the fundamental 50–60 Hz currents and all harmonics of interest. This normally includes harmonics up to the fortieth, i.e. 2–2.4 kHz. A pass band of 30–2,500 Hz. is therefore appropriate.

Next the sensing coil voltages are captured in simultaneous sample and hold circuits 38. Sequential sampling would introduce a phase angle error corresponding to the delay, which would affect the accuracy of the results. A minimum sampling frequency of 5000 Hz is preferably used.

A block of data is sampled. This would typically be 5 cycles but can be more or less down to 1 cycle depending on the specific application. For accuracy in subsequent arms calculations and fourier transformation of the data it is important to sample an integral number of fundamental cycles. The sampling frequency should be adapted to the supply frequency to achieve an integral number of samples and cycles in a block of data for varying supply frequency. This may entail using a separate analog filter to extract the fundamental 50–60 Hz component from one of the coils and counting the zero crossings on this signal to measure the frequency.

The sampled signals are then passed through a multiplexer 40 for conversion to digital form in an ADC converter 42 for further digital processing. The cycle is then repeated. For continuous monitoring there should be two processes running in parallel. One continuously samples blocks of coil data and transfers these to buffers. The other reads these buffers and processes the data to derive engineering results, i.e. the current values.

Figure 4:
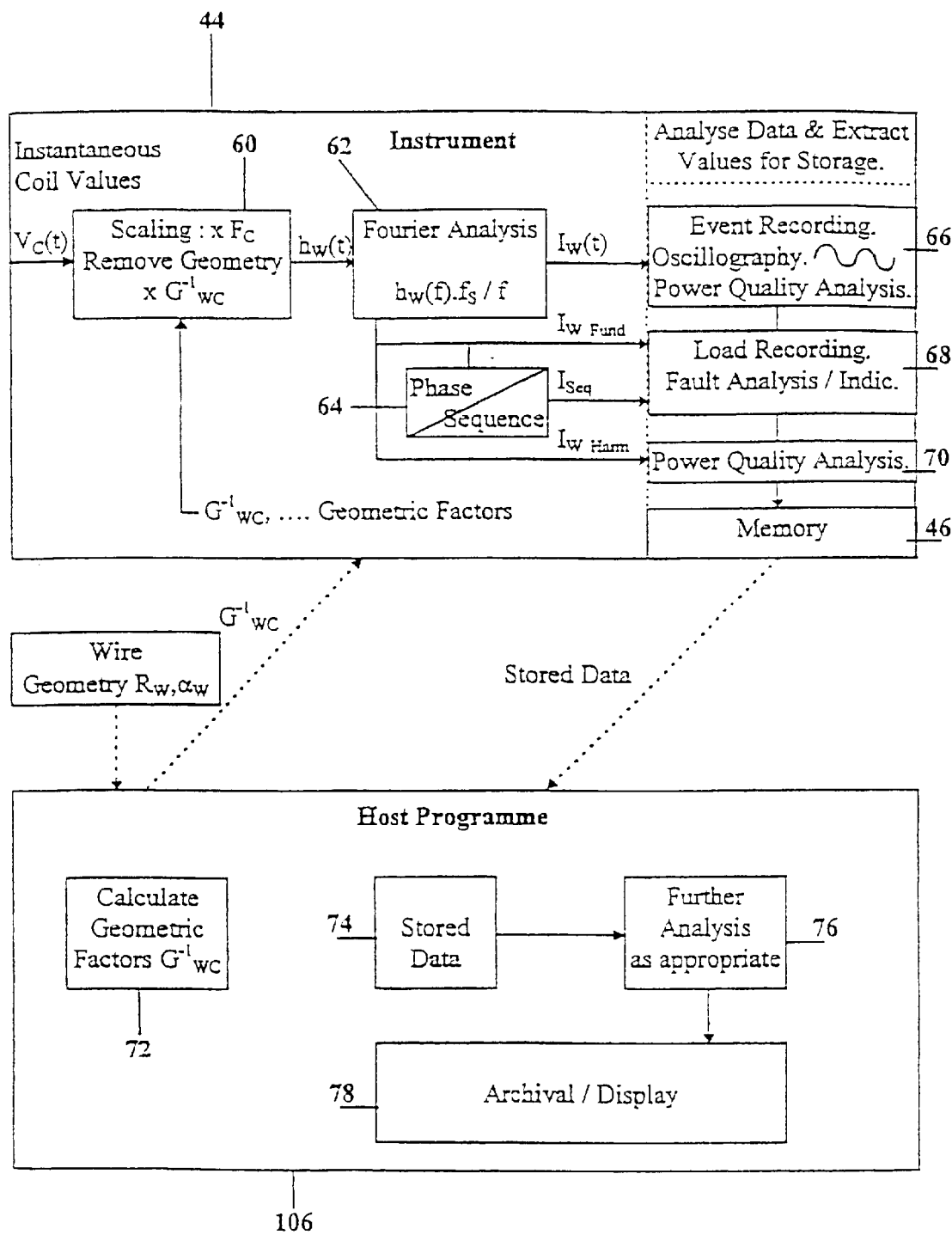
FIG. 4 shows how the processing of the signals from the sensing coils is divided, in the embodiment, between the instrument and the PC.

The instantaneous digital values $V_c$ (t) are processed digitally in a processor 44, firstly by scaling the voltages, using coil constants $F_c$, to give magnetic field intensities $H_c$ (t) and then by a linear transformation to cancel out the effect of the conductor geometry relative to the coils, see block 60, FIG. 4. This is detailed in Appendix 1. The scaling factors incorporate externally definable calibration factors to facilitate periodic re-calibration of the instrument. This produces signals $h_w$ (t) close to the individual conductor currents.

The linear transformation 60 requires certain geometric factors $G^{-1}{}_{wc}$. As detailed in Appendix 1, these are derived from the external geometric parameters $R_w$, $\alpha_w$ for the conductors and from the internal geometric data $\Delta X_c$, $\Delta X_c$, $\theta_c$, etc., for the coils. The external geometric parameters are input manually to the host program 106 loaded on the PC 12' or 12". The internal geometric data is stored internally for the instrument. The host program calculates the composite geometric factors (72, FIG. 4) and uploads them to the instrument 10.

In the case of coils as magnetic sensors the voltages induced in the sensing coils M1, M2 are determined by frequency in addition to the magnitude of the conductor currents. The sensed voltages are proportional to the product of current magnitude and frequency. Thus the harmonic currents produce signal components amplified by their frequency or harmonic order, e.g. the tenth harmonic produces a signal ten times greater than an equivalent fundamental current. The signals $h_w$ (t) must now be adjusted to compensate for the distortion produced by this amplification of harmonics to accurately and completely derive the original currents.

Figure 6:
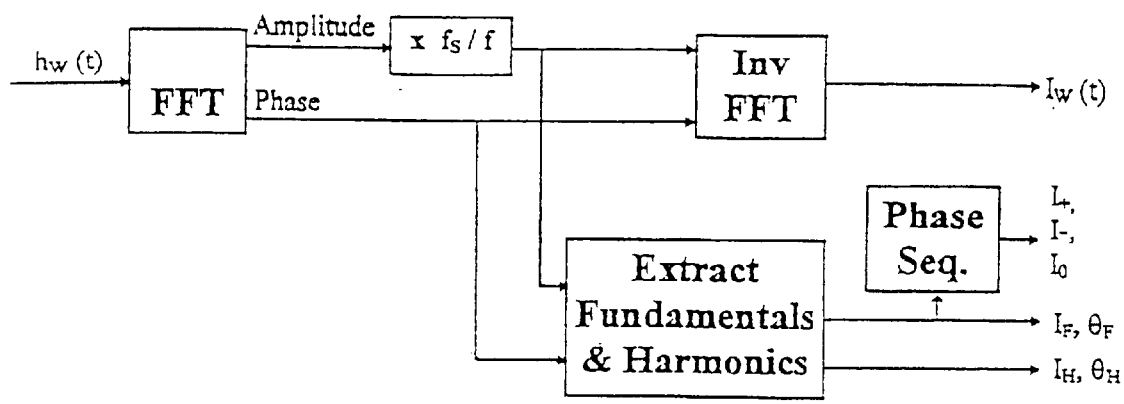
FIG. 6 illustrates the use of Fourier analysis on the signals derived from the sensing coils.
Figure 7:
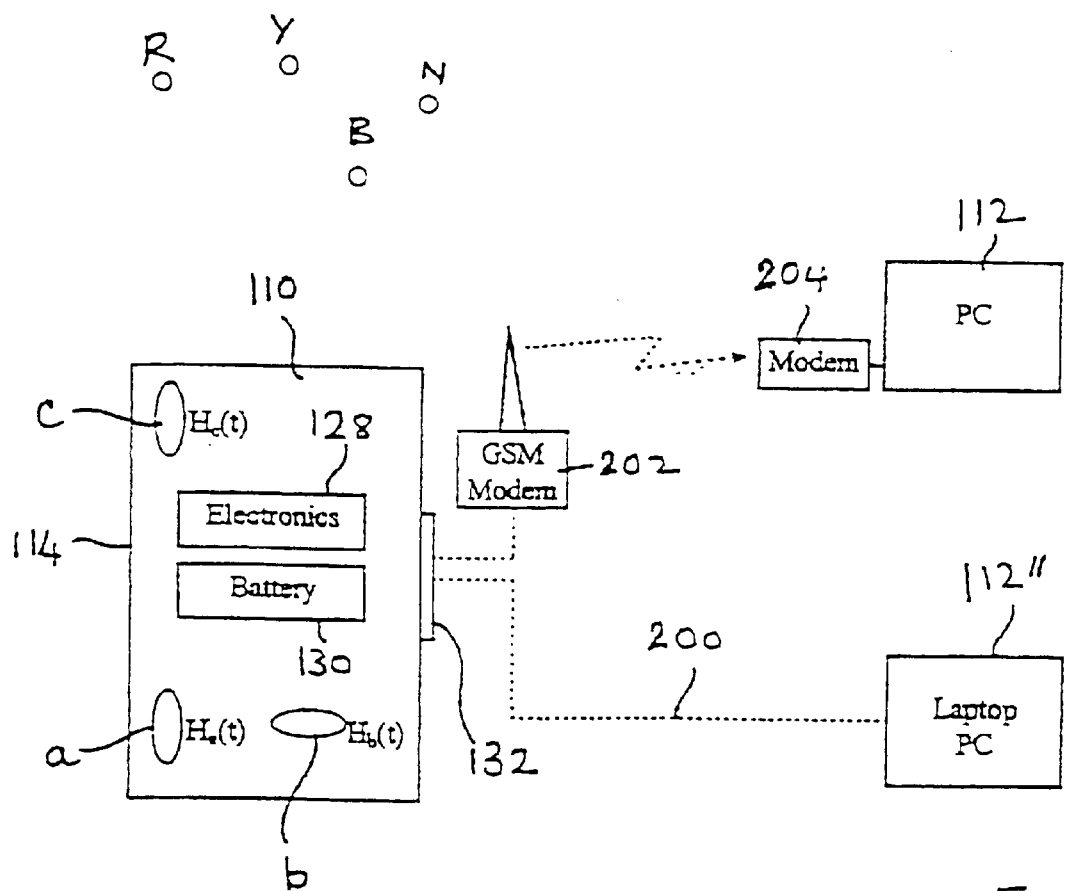
FIG. 7 is a schematic view of an apparatus according to a second embodiment of the invention, including a post-mounted instrument and an associated PC.

The signals $h_w$ (t) are subject to fourier analysis 62, as shown in more detail in FIG. 6. The fast fourier transform (FFT) may be used where the number of samples in a data block is a power of 2, i.e. equals $2^N$ where N is an integer. The sampling frequency can be arranged to achieve this. For example for nominal 50 Hz currents and 5 cycle data blocks this can be achieved with a sampling frequency of 5,120 Hz or 512 samples per block. The fourier transform isolates the individual frequency components in the signals $h_w$ (t). For example the fundamental components of the signals will typically occur as the fifth element in the FFT transformed data, where we have 5 cycles per block of data. The harmonic components will reside at integral multiples of this location, e.g. position 10 for the second harmonic in the case of 5 cycles per block of data, etc. The magnitudes of each frequency component can then be divided by the harmonic order, i.e. $f/f_s$ where $f_s$ is the supply frequency, to cancel the frequency amplification effect.

An inverse fourier transform is then applied to the adjusted data to re-create the original currents. Note that the FFT transformation produces complex number values at each frequency to incorporate both the magnitude and phase angle of the signal at each frequency. The inverse FFT should incorporate both the adjusted magnitudes and the original phase angles to accurately reproduce the conductor currents as a sequence of values over time.

The FFT transformation and its inverse are standard mathematical techniques. They are described in digital signal processing (DSP) books and are available as standard functions in most DSP software libraries. The digital signal processing to compensate for harmonic amplification effects can be implemented in a DSP chip or in a DSP component in a composite controller housing a DSP element. It can also be implemented in software in an embedded PC environment or in a high power micro-controller.

The resulting values $I_w$ (t) describe the independent conductor currents as a sequence of instantaneous values over the period covered by the sampling block. The FFT transformation as a by product also produces the fundamental current magnitudes and phase angles for each of the conductors. For three phase currents in the case of a 3 phase overhead power line the fundamental frequency values can be converted (64, FIG. 4) to symmetrical component values, i.e. to describe the positive, negative and zero sequence components of the conductor currents. This is done using the conventional phase to sequence transformation as described in the summary of equations. The FFT transformation also produces magnitudes and phase angles for the harmonic components of the conductor currents. Any or all of this data can be used for further processing, e.g. for power quality analysis or event recording, load recording or fault analysis, etc., as indicated by blocks 66 to 70 in FIG. 4. For example, the instantaneous current values can be stored in response to an event trigger to record the current waveshapes associated with a disturbance or event such as a fault, i.e. in disturbance/event recorder or oscillography applications. The positive and zero sequence currents can be monitored to indicate faults in fault passage indicator applications, etc. Any of the data can also be time stamped and stored in the memory 46 for later retrieval and processing.

Alternatively the data can be condensed by averaging it over user defined time intervals typically 10 minutes. In this case the instantaneous values are aggregated to compute root mean square (rms) values initially for each block and then for the blocks within the time period of interest. The resulting rms values for the current information or parameters of interest are time stamped or structured in a defined time sequence and stored in memory 46 for subsequent retrieval and analysis. In such cases there should be sufficient memory to store at least four weeks of data at ten minute intervals.

Upon request of the host program 106 via the cable connection 100 or communications link 102/104, the instrument 10 uploads the data stored in memory 46 to the PC 12' or 12" where it is stored at 74. It is then available for further processing 76 and/or archived or displayed 78. The host program 106 may carry out one or more of the functions 66 to 70 instead of the instrument 10.

In addition to performing calculations and analysis on the data from the instrument 10, the host program also provides programmable software calibration factors for the sensing coils, since it is necessary to periodically re-calibrate the instrument.

Also, it is desirable to have a low battery voltage software flag in the instrument 10 to signal the condition to the host program at the next linkup.

The instrument 10 is preferably rated to measure 0–1000 amp conductor currents and may be constructed to operate over user-selectable ranges,.e.g. 0–500 and 0–1000 amps.

The instrument 10 is capable of processing the signals from the sensing coils to achieve an instrument accuracy of 1% relative to the balanced line currents. The overall accuracy of results, taking account of the external geometric factors and processing in the host program is 5%.

As mentioned above, in practice the angles $\theta_c$ between the planes of the coils and the instrument reference plane S are set to 0° or 90°. The reason for this is that in such case Cos $\theta_c$ and Sin $\theta_c$ become either 0 or 1 in the attached equations so that the terms are therefore simplified accordingly. This leads to considerably easier and faster calculation. However, as mentioned before, the coils can have any angular orientation relative to the reference plane S and the full equations are therefore given.

Even so, the attached equations deal only with the case where the plane of each coil is parallel to the conductors. However, it is quite possible to develop the equations further to cater for the planes of the coils not necessarily being parallel to the wires, and the invention is intended to cover that possibility.

The foregoing has described a general instrument capable of measuring currents in a wide variety of situations, such as the AC rail traction system or overhead power line described.

A second embodiment of the invention, now to be described, is designed expressly for the purpose of remotely measuring the currents flowing in an AC overhead power line with up to four substantially parallel wires (and hence up to three independent currents).

Referring to FIGS. 7 to 10 of the drawings, the apparatus according to the second embodiment of the invention includes an instrument 110 and an associated PC 112' or 112". The instrument 110 comprises an enclosure or housing 114 containing three magnetic field sensors a, b and c. In this embodiment the sensors are coils. The instrument 110 is mounted on a post (not shown) below the an AC overhead power line having four substantially parallel wires R, Y, B and N whose currents are to be measured. The post on which the instrument is mounted may the same pole or pylon carrying the wires.

Although the apparatus is capable of measuring the wire currents in AC power distribution systems using less than four overhead wires, the drawings show the apparatus in use with a system using four substantially parallel overhead wires R, Y, B and N where the wires R, Y, B carry three current phases respectively and the wire N is a neutral wire. The wires can be in any configuration provided they are substantially parallel to each other. The wires are typically mounted horizontally next to one another 1 m apart, and in such case the instrument 110 is preferably mounted from 3 to 5 m, typically about 4 m, below them. It is not necessary for the instrument 110 to be located symmetrically relative to the wires.

Figure 8:
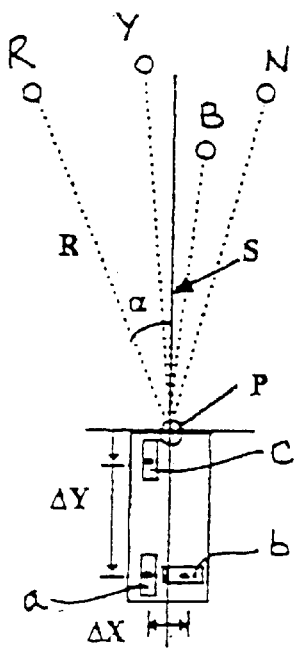
FIG. 8 is a diagram illustrating the geometric parameters which are measured and used in the calculations according to Appendix 2.

Referring to FIG. 8, the instrument 110 has a reference point P and a notional, but known, reference plane S passing through the point P. The instrument 110 is fixed such that the reference plane S is parallel to the wires R, Y, B and N. In practice the reference plane S is approximately vertical, as shown, but this is not necessary. The coils a, b, c are arranged within the housing 114 such that the plane of each coil is also parallel to the wires.

Within the housing 114 the location of each coil relative to the reference point P is known (it is determined during manufacture). The coil locations are given by $(\Delta X_a, \Delta Y_a)$, $(\Delta X_b, \Delta Y_b)$ and $(\Delta X_c, \Delta Y_c)$ which are the offsets of the centres of the coils a, b and c respectively from the instrument reference point P, the $\Delta Y$ values being measured parallel to the instrument reference plane S and the $\Delta X$ values being measured perpendicular to the instrument reference plane S.

The angular orientation of each coil relative to the reference plane S is also known. $\theta_a$, $\theta_b$ and $\theta_c$ are the angles between the planes of the coils a, b and c respectively and the instrument reference plane S. In practice, as shown in FIG. 8 and for reasons of simplification to be described later, the coils are arranged such that $\theta_a=0°$, $\theta_b=90°$ and $\theta_c=0°$ but this is not necessary and the coils can be arranged at any orientation relative to the plane S provided their planes are still substantially parallel to the wires. Preferably, but not necessarily, for convenience of packaging in a compact housing 114 the coils a and b are located in proximity and at right angles to each other, while the coil c is located above or below the coils a, b. The coils can be separated in the direction parallel to the wires to avoid mutual interference.

When the housing 114 is fixed in position as aforesaid, it is necessary to know the respective radial distance $R_1$, $R_2$, $R_3$ and $R_4$ of the reference point P from each wire R, Y, B and N, and also the respective angular displacement $\alpha_1$, $\alpha_2$, $\alpha_3$ and $\alpha_4$ of each wire R, Y, B and N from the reference plane S. This is most preferably achieved by providing the instrument 110 with a docking station in which an ultrasonic measuring device can be installed to measure the radial distances to the wires and rotating this to measure the angles.

Alternatively, the instrument can be installed on a pole with the instrument aligned with the pole, i.e. its reference plane running along the axis of the pole. The height below the central wire is measured with such as an ultrasonic instrument. The lateral displacements of the wires form the pole centre and any vertical displacements above or below the central wire are known from construction standards. This data can be entered in a PC host programme to derive the wire geometry relative to the instrument.

When all these values are known, it will be appreciated that one has a precise knowledge of the location and angular orientation of each coil a, b and c relative to each wire R, Y, B and N.

In use a respective instantaneous voltage $H_a(t)$, $H_b(t)$ and $H_c(t)$ will be induced in each coil a, b and c which is proportional to the instantaneous value of the magnetic field at the respective coil. The coils can be wound on ferrite cores to improve sensitivity provided this does not cause mutual distortion between the two coils a, b if they are in close proximity.

The enclosure 114 contains electronics 128 powered by a battery 130, and has a standard RS232 interface 132 for communication over a direct cable connection 200 with the serial port of a PC 112", for example a laptop PC, or over a communications link such as a modem or GSM module 202 to a PC 112' via a modem 204 at the PC. It is to be understood that the PCs 112' and 112" illustrate two different ways of connecting a PC to the instrument 110, and in general only one such PC will be used at any given time. The port 132 is programmable for a range of Baud rates (1,200–19,200 bps), and implements appropriate flow control and error checking.

The instrument 110 is capable of communicating with a host program 206 (FIG. 10) in the PC 112' or 112" to download data to the PC on request. It is also capable of receiving from the PC user selectable parameters such as the integration time intervals to be described, of having the instrument clock checked or reset, of indicating the time span over which data has been logged, etc.

The host program 206 in turn is capable of communicating with the instrument 110 for assessing the status of the instrument and its data content. It is capable of initiating a download of the data from the instrument and of controlling the data flow. It is capable of receiving and processing geometric data (to be described) for the site in question. It is capable of converting the raw instrument data to current values as necessary. It is capable of archiving all the data for a site in a database entry for that site. It is capable of retrieving, displaying and graphing data for a site as required.

Figure 9:
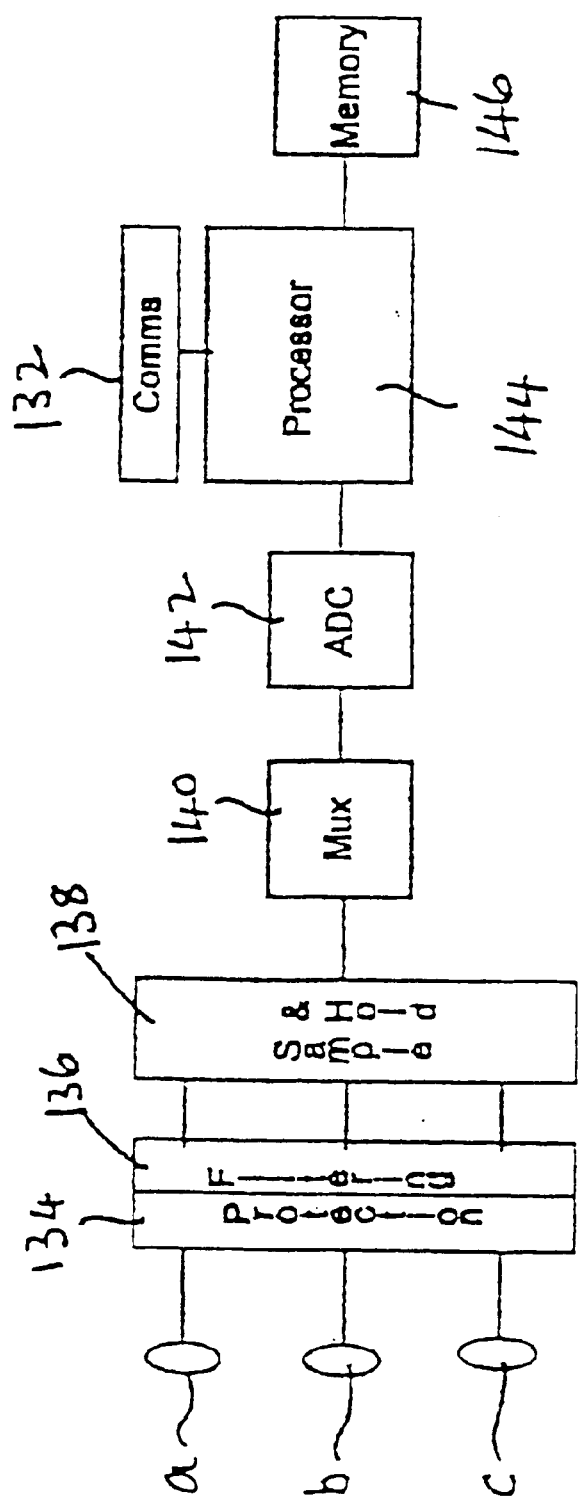
FIG. 9 is a block diagram of the electronic circuitry within the instrument of FIG. 7.

FIG. 9 is a block diagram of the electronics 128. The voltages from the coils a, b, c are first clamped in protection circuits 134 to provide over-voltage protection, to avoid damaging the instrument electronics in the event of a disturbance. They are protected against the equivalent of a symmetrical fault current of 20,000 amps in the overhead line. The instrument does not have to measure such currents. It is only necessary to avoid being damaged by them.

The voltages from the coils are then filtered by low pass filters 136 to pass fundamental, i.e. 50 to 60 Hz data, and to cut off harmonics above this frequency range.

Next the sensing coil voltages are captured in simultaneous sample and hold circuits 138. Sequential sampling would introduce a phase angle error corresponding to the delay, which would affect the accuracy of the results. A minimum sampling frequency of 500 Hz is used with a preferred sampling frequency of 1,000 Hz. The sampled signals are then passed through a multiplexer 140 for conversion to digital form in an ADC converter 142.

Figure 10:
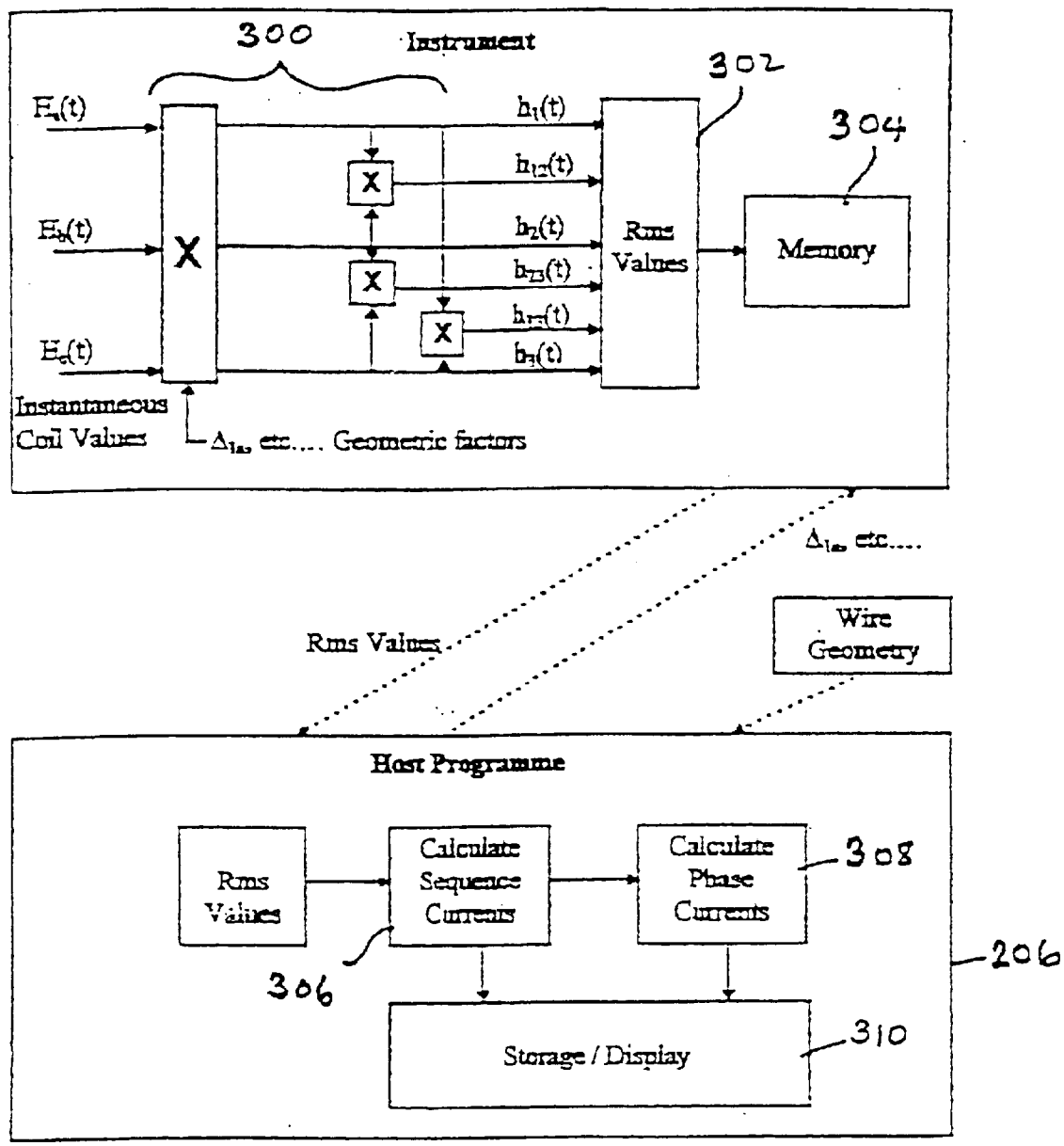
FIG. 10 shows how the processing of the signals from the sensing coils is divided, in the second embodiment, between the instrument and the PC.

From each set of three instantaneous digital coil values $H_a$ (t), $H_b$ (t) and $H_c$ (t) a processor 144 derives a respective set of six instantaneous derivative digital values $h_1$ (t), $h_2$ (t), $h_3$ (t), $h_{12}$ (t), $h_{13}$ (t) and $h_{23}$ (t), step 300, FIG. 10. The formulae for deriving the derivative values from the instantaneous digital coil values are given in the attached Appendix 2.

It will be noted in Appendix 2 that the calculation of the derivative values requires certain geometric factors $\Delta_{1a}$, $\Delta_{1b}$, $\Delta_{1c}$, $\Delta_{2a}$, $\Delta_{2b}$, $\Delta_{2c}$, $\Delta_{3a}$, $\Delta_{3b}$ and $\Delta_{3c}$. These are derived from the geometric parameters $R_1$, $R_2$, $R_3$, $R_4$, $\alpha_1$, $\alpha_2$, $\alpha_3$ and $\alpha_4$ previously referred to. These geometric parameters are input manually to the host program 206 (FIG. 10) loaded on the PC 112' or 112". The host program calculates the geometric parameters and uploads them to the instrument 110.

The derivative digital values so calculated are integrated by the processor 144 to derive equivalent rms values over user selected time intervals, step 302, FIG. 10. The time interval options are 5, 10, 15, 20 and 30 minutes, which are programmable into the instrument 110 from the host program 206 at set up time. The rms data is time stamped and logged into memory 146, or structured in a defined time sequence in memory, for later retrieval, step 304. There is sufficient memory to store four weeks of data at ten minute intervals. In the event of running out of memory space the instrument overwrites the oldest data stored.

Upon request of the host program 206 via the cable connection 200 or communications link 202/204, the instrument 110 uploads the rms values in memory 146 to the PC 112' or 112". As seen in FIG. 10, step 306, using the rms values the host program 206 calculates three so-called sequence currents, a positive sequence current $I_x$ which is in effect the average current in the wires, a negative sequence current $I$ which is in effect the load unbalance current, and a zero-sequence current $I_0$ which is in effect the leakage current to earth in the event of a fault or the neutral current in the case of a four wire circuit. From these sequence currents the host program 206 calculates, in amperes, the actual currents $I_R$, $I_Y$, $I_B$ and $I_N$ in the wires, step 308. The formulae which the host program uses to calculate these are set out in Appendix 2.

The current values thus calculated may be displayed on the PC monitor by the host program 206, or stored in PC memory, step 310.

In addition to calculating the currents in the wires, the host program also provides programmable software calibration factors for the sensing coils, since it is necessary to periodically re-calibrate the instruments.

Also, it is desirable to have a low battery voltage software flag in the instrument 110 to signal the condition to the host program at the next linkup.

The instrument 110 is preferably rated to measure 0–1000 amps as a balanced current in all three wires of an overhead line or as a fault current in any one wire with return through the earth, and may have two or more user selectable ranges, e.g. 0–500 and 0–1000 amps. The user could select between them at set up time.

The instrument 110 is capable of processing the signals from the sensing coils to achieve an instrument accuracy of 1% relative to the balanced line currents. The overall accuracy of results, taking account of the external geometric factors and processing in the host program is 5%.

Although the foregoing has described all three coils a to c as being located below the wires R, Y, B and N, this is only for ease of accommodating them in a single relatively small enclosure 114. Each of the coils could be located above or below the wires, provided that they meet the positional requirements specified above.

Although the second embodiment has been described in use with the most demanding case of four overhead wires R, Y, B and N, it can also be used to measure the currents in two- or three-wire power distribution systems. In the two-wire system, which uses wires R and N or two of the phases for example, the geometric parameters $R_3$ and $R_4$ are set to infinity, while in the three-wire system, which uses wires R, Y and B, the geometric parameter $R_4$ is set to infinity.

As mentioned above, in practice the angles $\theta_a$, $\theta_b$ and $\theta_c$ between the planes of the coils a, b and c respectively and the instrument reference plane S are set such that $\theta_a=0°$, $\theta_b=90°$ and $\theta_c=0°$. The reason for this is that in such case Cos $\theta_a$, Sin $\theta_a$, etc. become either 0 or 1 in the attached equations so that the Cos $\alpha_{a1}$, etc. terms are therefore simplified accordingly. This leads to considerably easier and faster calculation. However, as mentioned before, the coils can have any angular orientation relative to the reference plane S and the full equations are therefore given.

Even so, the attached equations deal only with the case where the plane of each coil is parallel to the wires. However, it is quite possible to develop the equations further to cater for the planes of the coils not necessarily being parallel to the wires, and the invention is intended to cover that possibility.

The enclosure 14 or 114 in which the instrument 10 or 110 is housed is a robust enclosure for field use. With access panels closed it provides protection to IP64 in line with IEC standard 529. The enclosure and seals are capable of withstanding continuous exposure to sunlight, rain, frost, etc., without undue degradation over a life of 10 years.

The mounting arrangement for the instrument 10 or 110 can take the form of a bracket that could be attached to a wooden pole with coach screws. Alternatively lugs and mounting bands could be employed to attach the instrument to any type of pole. It should be as easy to remove the instrument as to install it. The mounting arrangement should hold the instrument in a secure position on the pole so that there is no movement or tilting in the event of winds.

In addition to the external comms port 32 or 132 the instrument has an on/off switch. The on/off switch may also serve as a reset switch to cope with the possibility of a lock up during instrument set up. The comms port and on/off switch may be located behind such as a perspex door. It should be possible to apply a standard wire seal to the door to avoid tampering with the instrument.

The instrument preferably has two indicating LEDs, one to indicate power on and the other to indicate that the instrument is fully set up and logging data. These can also be installed behind a transparent door.

The instrument 10 or 110 is powered by the battery 30 or 130 to support continuous normal operation over a period of five years. The battery is a standard readily available size. It should be possible to replace the battery in the field with standard tools. The instrument can be removed from the pole to fit a new battery.

The instrument 10 or 110 should preferably operate accurately within the following service conditions:

Maximum temperature: 40 deg C

Minimum temperature: −10 deg C

Relative humidity: 0–85%

Elevation above sea level: 0–1,000 m.

Maximum wind gust velocity: 50 m/s.

The invention is not limited to an apparatus where the processing is split between an on-site instrument and a remote processor. The entire apparatus could be accommodated in a single housing on-site. The division of data processing and functionality between an instrument and host software in a PC can vary with specific applications. Also the basic current measurement functionality could be implemented as a discrete entity and used as a front end in or with other conventional instrumentation to feed remotely sensed current data into the instrument for further analysis or processing, e.g. power quality analysis, fault indication, etc.

Also, the apparatus need not be fixed in position on a pole or the like. Embodiments in the form of a hand-held device are possible. In that case the geometric parameters would be measured by a measuring device, e.g. ultrasonic, laser, etc., built into the instrument, readings being taken simultaneously with the readings of the magnetic field.

The invention is not limited to the embodiment described herein which may be modified or varied without departing from the scope of the invention.

APPENDIX 1

Geometric Factors:

Given:

A set of conductors (wires) carrying N independent currents. Each of these currents flows out in a primary conductor denoted by the subscript W for wire. Each of the currents can return in one or more return conductors denoted by W' for the first such return conductor and W", etc. for any subsequent conductors.

$R_w$, $\alpha_w$ measure the conductor geometry of one of the primary conductors relative to the instrument. These values respectively are the radial distances $R_w$ from the instrument reference point to the centre of the conductor and the angular displacements $\alpha_w$ of the conductor from the instrument reference plane. The angular displacements are measured positive in the counter clockwise direction from the instrument reference plane. $R_{w'}$, $\alpha_{w'}$, $R_{w''}$, $\alpha_{w''}$, etc. measure the conductor geometry of any associated return conductors relative to the instrument. This gives us a set of conductor geometries as follows:

$R_1, \alpha_1, R_2, \alpha_2, R_3, \alpha_3, \ldots R_N, \alpha_N$.

$R_{1'}, \alpha_{1'}, R_{2'}, \alpha_{2'}, R_{3'}, \alpha_{3'}, \ldots R_{N'}, \alpha_{N'}$.

$R_{1''}, \alpha_{1''}, R_{2''}, \alpha_{2''}, R_{3''}, \alpha_{3''}, \ldots R_{N''}, \alpha_{N''}$.

In addition for any return conductor(s) we define parameter(s) $\lambda_{w'}$, $\lambda_{w''}$, etc., which specify the fraction of the current in question that returns in each of these conductors. For example with two rails for return current we would typically have $\lambda_{w'} = \lambda_{w''} = 0.50$.

A set of N magnetic field sensors or sensing coils. These are denoted by the subscript C for coil $\Delta X_c$, $\Delta Y_c$ are the coil offsets from the instrument reference point to the geometric centres of these sensing coils. These are measured positive from the reference point in the conventional sense, i.e. to the right and up. $\theta_c$ are the orientations of the planes of these coils with the instrument reference plane. These are measured positive in the counter clockwise direction from the instrument reference plane, e.g. a coil with its plane parallel to the reference plane has $\theta_c = 0°$ or $180°$ depending on polarity. This gives us a set of coil geometries as follows:

$\Delta X_1, \Delta Y_1, \theta_1, \Delta X_2, \Delta Y_2, \theta_2, \Delta X_3, \Delta Y_3, \theta_3, \ldots \Delta X_N, \Delta Y_N, \theta_N$.

Transform the measured conductor geometry to each of the sensing coils as follows:

$R_{cw} = \sqrt{[R_w^2 + \Delta X_c^2 + \Delta Y_c^2 + 2 \cdot R_w \cdot (\sin \alpha_w \cdot \Delta X_c - \cos \alpha_w \cdot \Delta Y_c)]}$.

$\cos \alpha_{cw} = [(R_w \cdot \cos \alpha_w - \Delta Y_c) \cdot \cos \theta_c + (R_w \cdot \sin \alpha_w + \Delta X_c) \cdot \sin \theta_c] / R_{cw}$.

C=1 . . . N and W=1 . . . N.

This produces a separate set of geometric data adapted to the orientations and positions of each of the sensing coils. Thus for N sensing coils the complete external conductor geometry is transformed N times.

Calculate the geometric terms:

$G_{cw} = \cos(\alpha_{cw}) / 2\pi R_{cw} - \lambda_{w'} \cdot \cos(\alpha_{cw'}) / 2\pi R_{cw'} - \lambda_{w''} \cdot \cos(\alpha_{cw''}) / 2\pi R_{cw''} - \ldots$ C=1 . . . N and W=1 . . . N.

This produces a matrix of N ×N terms corresponding to the N sensing coils and the N independent currents in the set of conductors.

Invert this N ×N matrix in the above terms to derive the geometric factors $G^{-1}_{wc}$.

Note that in the particular case of a 3 phase 4 conductor circuit (FIG. 5) we only have 3 independent currents. The current in the fourth conductor is dependent on that in the three phase conductors. We therefore only need 3 sensing coils to fully characterise the currents in all the conductors.

In this case we do not have a separate return conductor for each of the phase currents. Most of the current, i.e. all the positive and negative sequence current, sums to zero in the load. The fourth conductor serves as a common return conductor for the residual or zero sequence current for all three phases. We formulate the geometric equations somewhat differently in this case. Let $\lambda$ be the fraction of residual or zero sequence current returning in the fourth or neutral conductor. This is taken as 1.0 by default.

The external conductor geometry $R_w$, $\alpha_w$ is measured relative to the instrument for all 4 conductors. This produces 4 pairs of values. This data is transformed to each of the 3 sensing coils as before to give:

$R_{cw} = \sqrt{[R_w^2 + \Delta X_c^2 + \Delta Y_c^2 + 2 \cdot R_w \cdot (\sin \alpha_w \cdot \Delta X_c - \cos \alpha_w \cdot \Delta Y_c)]}$ $\cos \alpha_{cw} = [(R_w \cdot \cos \alpha_w - \Delta Y_c) \cdot \cos \theta_c + (R_w \cdot \sin \alpha_w + \Delta X_c) \cdot \sin \theta_c] / R_{cw}$.

C=1 ... 3 and W=1 ... 4.

Note also that in this case in practice we would take $\theta_1=0°$, $\theta_2=90°$ and $\theta_3=0°$ so that $\cos \theta_c$, $\sin \theta_c$ above become either 0 or 1. This simplifies the expression for $\cos \alpha_{cw}$.

This produces 12 pairs of values. The geometric terms are also calculated as before:

$G_{cw} = \cos(\alpha_{cw}) / 2 \pi R_{cw}$.

C=1 ... 3 and W=1 ... 4.

This gives us a matrix with 3 rows and 4 columns. We use the fact that the current in the fourth conductor is the residual current from the three phase conductors, i.e. the currents in all four conductors sum to 0. Allowing for the fact that some of the residual current in practice may be returning through the earth we have:

$\lambda(I_1 + I_2 + I_3) + I_4 = 0$.

We now add the coefficients of this euation to the geometric matrix, i.e. $G_{4w} = [\lambda, \lambda, \lambda, 1]$. We invert the full 4×4 matrix to get $G^{-1}_{w4}$. Drop the rightmost column in this 4×4 matrix since the term that would be multiplied by these factors is 0. This gives a 4×3 matrix $G^{-1}wc$ for deriving each of the 4 conductor currents from the 3 coil readings.

In each case we now have the geometric factors $G^{-1}_{wc}$ for eliminating the effect of the conductor geometry from the sensing coil readings. The resulting values are directly related to the conductor currents.

Remove Geometry:

Firstly apply the scaling factors for the coils to convert the signals, e.g. in volts, to units of magnetic field intensity, i.e. A/m. These scaling factors or constants $F_c$ accommodate the numbers of turns in each coil, calibration constants, etc. Thus $H_c(t) = F_c \cdot V_c(t)$.

Using the scaled sensing coil readings $H_c(t)$ transform these readings to eliminate the conductor geometry:

$$h_w(t) = \sum_{C=1}^{N} G^{-1}_{WC} \times H_C(t) = G^{-1}_{W1} \times H_1(t) + G^{-1}_{W2} \times H_2(t) + \ldots + G^{-1}_{WN} \times H_N(t)$$

$W = 1 \ldots N$.

Where fundamental frequency (50/60 Hz) quantities only are being processed these values $h_w(t)$ would be the actual conductor currents $I_w(t)$. Thus $I_w(t) = h_w(t)$.

Fourier Analysis:

In advanced applications the desired currents can also have harmonic or transient components. The instrument is monitoring the voltages induced in the coils. These are proportional to frequency in addition to the current magnitude. So the signal components associated with current components above or below the fundamental frequency are amplified in proportion to the ratio of their frequency to the fundamental frequency, i.e. by $f/f_s$ where $f_s$ is the fundamental frequency. We have to compensate for the distortion produced by this effect.

We use fourier analysis to separate the frequency components of the current signals. The amplitudes are divided by the ratio $f/f_s$ to cancel the harmonic amplification. The adjusted values can then be recombined with an inverse fourier transform to produce the fully compensated signals representing the true conductor currents $I_w$. This process is illustrated schematically in FIG. 6.

Note that the above process can be performed for each of the current individually. However for the phase sequence conversion to derive symmetrical component current values in the case of three phase currents the data for the three phases in question must be available to the conversion process.

The number of samples in a block of data is selected to be an integral power of 2 so that the fast fourier transform (FFT) and its inverse can be used. This reduces the computational effort in processing the data.

Process Data

The harmonic amplification adjustment process produces a set of instantaneous values describing the individual conductor currents $I_w(t)$. This effectively described the wave shapes of the conductor currents to the precision allowed by the sampling rate. This instantaneous data can be directly stored, displayed or made available to other processes within the instrument or to other instruments for further analysis.

If desired rms values can be computed over specified integration periods as follows:

$$I_w^{rms} = \sqrt{\left[\sum_{t=1}^{M} I_w^2(t) / M\right]}.$$

This data would typically be time stamped and stored in memory.

The fourier analysis as a by-product extracts the harmonic currents and their phase angles over the period of a sampling block of data. This data can likewise be stored, displayed or made available to other processes within the instrument or to other instruments for further analysis. Rms values can be computed over specified integration periods. This data can also be time stamped and stored in memory.

Sequence Currents

The fourier analysis as a by-product also extracts the fundamental currents $I_F$ and their phase angles $\theta_F$ over the period of a sampling block of data. For three phase currents this data can be converted to sequence or symmetrical component currents for the data block in question. The phase current magnitudes $I_\phi$ and their phase angles $\theta_\phi$, where $\phi$ is a sub-script corresponding to the phases 1, 2, 3 or R, Y, B, are most conveniently combined to form complex number representations of the phase currents in the form X+iY. Taking $\alpha = -\frac{1}{2} + i\sqrt{3}/2$ and $\alpha_2 = -\frac{1}{2} - i\sqrt{3}/2$ then $I_+ = (I_R + \alpha \cdot I_Y + \alpha^2 \cdot I_B) / 3$ $I_- = (I_R + \alpha^2 \cdot I_Y + \alpha \cdot I_B) / 3$ $I_0 = (I_R + I_Y + I_B) / 3$ where $I_+$ is the positive sequence current representing balanced load conditions, $I_-$ is the negative sequence current representing load unbalance within the three phases and $I_0$ is the zero sequence current representing residual current either as a natural current from load unbalance or fault current from one or more of the phases or a combination of both.

These symmetrical component currents can also be integrated or averaged over user designated time intervals to provide rms values as a profile over time. This data can also be time stamped and stored.

APPENDIX 2

Geometric Factors:

Given:

$\lambda$= Fraction of zero sequence current returning in the neutral conductor =1.0 by default.

$(R_1, \alpha_1)$, $(R_2, \alpha_2)$, $(R_3, \alpha_3)$ and $(R_4, \alpha_4)$ measure the wire geometry relative to the instrument.

$R_1$, $R_2$, $R_3$ and $R_4$ are the radial distances from the instrument reference point P to the wires R, Y, B and N respectively, and $\alpha_1$, $\alpha_2$, $\alpha_3$ and $\alpha_4$ are the angular displacements of the wires R, Y, B and N respectively from the instrument reference plane S measured positive in an anticlockwise direction.

$(\Delta X_a, \Delta Y_a)$, $(\Delta X_b, \Delta Y_b)$ and $(\Delta X_c, \Delta Y_c)$ are the offsets of the centres of the coils a, b and c respectively from the instrument reference point P, the $\Delta Y$ values being measured parallel to the instrument reference plane S and the $\Delta X$ values being measured perpendicular to the instrument reference plane S. These are measured positive in the conventional sense, i.e. positive to the right and up from the reference point P.

$\theta_a$, $\theta_b$ and $\theta_c$ are the angles between the planes of the coils a, b and c respectively and the instrument reference plane S measured positive in an anticlockwise direction. Note that in practice we take $\theta_a$ =0°, $\theta_b$ =90° and $\theta_c$ =0° so that Cos $\theta_a$, Sin $\theta_a$, etc. become either 0 or 1. The Cos $\alpha_{a1}$, etc. terms are therefore simplified accordingly.

Transform the measured wire geometry to each of the coil positions:

$R_{a1} = \sqrt{[R_1^2 + \Delta X_a^2 + \Delta Y_a^2 + 2 \cdot R_1 \cdot (Sin\ \alpha_1 \cdot \Delta X_a - Cos\ \alpha_1 \cdot \Delta Y_a)]}$ $R_{a2} = \sqrt{[R_2^2 + \Delta X_a^2 + \Delta Y_a^2 + 2 \cdot R_2 \cdot (Sin\ \alpha_2 \cdot \Delta X_a - Cos\ \alpha_2 \cdot \Delta Y_a)]}$ $R_{a3} = \sqrt{[R_3^2 + \Delta X_a^2 + \Delta Y_a^2 + 2 \cdot R_3 \cdot (Sin\ \alpha_3 \cdot \Delta X_a - Cos\ \alpha_3 \cdot \Delta Y_a)]}$ $R_{a4} = \sqrt{[R_4^2 + \Delta X_a^2 + \Delta Y_a^2 + 2 \cdot R_4 \cdot (Sin\ \alpha_4 \cdot \Delta X_a - Cos\ \alpha_4 \cdot \Delta Y_a)]}$ Cos $\alpha_{a1}$=($R_1$. Cos $\alpha_1-\Delta Y_a$) / $R_{a1}$. Cos $\theta_a$+($R_1$. Sin $\alpha_1+\Delta X_a$) / $R_{a1}$. Sin $\theta_a$.

Cos $\alpha_{a2}$=($R_2$. Cos $\alpha_2-\Delta Y_a$) / $R_{a2}$. Cos $\theta_a$+($R_2$. Sin $\alpha_2+\Delta X_a$) / $R_{a2}$. Sin $\theta_a$.

Cos $\alpha_{a3}$=($R_3$. Cos $\alpha_3-\Delta Y_a$) / $R_{a3}$. Cos $\theta_a$+($R_3$. Sin $\alpha_3+\alpha X_a$) / $R_{a3}$. Sin $\theta_a$.

Cos $\alpha_{a4}$=($R_4$. Cos $\alpha_4=\Delta Y_a$) / $R_{a4}$. Cos $\theta_a$+($R_4$. Sin $\alpha_4+\alpha X_a$) / $R_{a4}$. Sin $\theta_a$.

$R_{b1} = \sqrt{[R_1^2 + \Delta X_b^2 + \Delta Y_b^2 + 2 \cdot R_1 \cdot (Sin\ \alpha_1 \cdot \Delta X_b - Cos\ \alpha_1 \cdot \Delta Y_b)]}$ $R_{b2} = \sqrt{[R_2^2 + \Delta X_b^2 + \Delta Y_b^2 + 2 \cdot R_2 \cdot (Sin\ \alpha_2 \cdot \Delta X_b = Cos\ \alpha_2 \cdot \Delta Y_b)]}$ $R_{b3} = \sqrt{[R_3^2 + \Delta X_b^2 + \Delta Y_b^2 + 2 \cdot R_3 \cdot (Sin\ \alpha_3 \cdot \Delta X_b = Cos\ \alpha_3 \cdot \alpha Y_b)]}$ $R_{b4} = \sqrt{[R_4^2 + \Delta X_b^2 + \Delta Y_b^2 + 2 \cdot R_4 \cdot (Sin\ \alpha_4 \cdot \Delta X_b = Cos\ \alpha_4 \cdot \Delta Y_b)]}$ Cos $\alpha_{b1}$=($R_1$. Cos $\alpha_1-\Delta Y_b$) / $R_{b1}$. Cos $\theta_b$+($R_1$. Sin $\alpha_1+\Delta X_b$) / $R_{b1}$. Sin $\theta_b$.

Cos $\alpha_{b2}$=($R_2$. Cos $\alpha_2-\Delta Y_b$) / $R_{b2}$. Cos $\theta_b$+($R_2$. Sin $\alpha_2+\Delta X_b$) / $R_{b2}$. Sin $\theta_b$.

Cos $\alpha_{b3}$=($R_3$. Cos $\Delta_3-\Delta Y_b$) / $R_{b3}$. Cos $\theta_b$+($R_3$. Sin $\alpha_3+\Delta X_b$) / $R_{b3}$. Sin $\theta_b$.

Cos $\alpha_{b4}$=($R_4$. Cos $\Delta_4-\Delta Y_b$) / $R_{b4}$. Cos $\theta_b$+($R_4$. Sin $\alpha_4+\Delta X_b$) / $R_{b4}$. Sin $\theta_b$.

$R_{c1} = \sqrt{[R_1^2 + \Delta X_c^2 + \Delta Y_c^2 + 2 \cdot R_1 \cdot (Sin\ \alpha_1 \cdot \Delta X_c - Cos\ \alpha_1 \cdot \Delta Y_c)]}$ $R_{c2} = \sqrt{[R_2^2 + \Delta X_c^2 + \Delta Y_c^2 + 2 \cdot R_2 \cdot (Sin\ \alpha_2 \cdot \Delta X_c - Cos\ \alpha_2 \cdot \Delta Y_c)]}$ $R_{c3} = \sqrt{[R_3^2 + \Delta X_c^2 + \Delta Y_c^2 + 2 \cdot R_3 \cdot (Sin\ \alpha_3 \cdot \Delta X_c - Cos\ \alpha_3 \cdot \Delta Y_c)]}$ $R_{c4} = \sqrt{[R_4^2 + \Delta X_c^2 + \Delta Y_c^2 + 2 \cdot R_4 \cdot (Sin\ \alpha_4 \cdot \Delta X_c - Cos\ \alpha_4 \cdot \Delta Y_c)]}$ Cos $\alpha_{c1}$=($R_1$. Cos $\alpha_1-\Delta Y_c$) / $R_{c1}$. Cos $\theta_c$+($R_1$. Sin $\alpha_1+\Delta X_c$) / $R_{c1}$. Sin $\theta_c$.

Cos $\alpha_{c2}$=($R_2$. Cos $\alpha_2-\Delta Y_c$) / $R_{c2}$. Cos $\theta_c$+($R_2$. Sin $\alpha_2+\Delta X_c$) / $R_{c2}$. Sin $\theta_c$.

Cos $\alpha_{c3}$=($R_3$. Cos $\alpha_3-\Delta Y_c$) / $R_{c3}$. Cos $\theta_c$+($R_3$. Sin $\alpha_3+\Delta X_c$) / $R_{c3}$. Sin $\theta_c$.

Cos $\alpha_{c4}$=($R_4$. Cos $\alpha_4-\Delta Y_c$) / $R_{c4}$. Cos $\theta_c$+($R_4$. Sin $\alpha_4+\Delta X_c$) / $R_{c4}$. Sin $\theta_c$.

Calculate the geometric terms:

A={Cos $(\alpha_{a1})$/ 2 $\pi R_{a1}$-½.Cos $(\alpha_{a2})$/ 2 $\pi R_{a2}$-½.Cos $(\alpha_{a3})$/ 2 $\pi R_{a3}$}

B={-√3/2.Cos $(\alpha_{a2})$/ 2 $\pi R_{a2}$+√3/2.Cos $(\alpha_{a3})$/ 2 $\pi R_{a3}$}

C={Cos $(\alpha_{a1})$/ 2 $\pi R_{a1}$+Cos $(\alpha_{a2})$/ 2 $\pi R_{a2}$+Cos $(\alpha_{a3})$/ 2 $\pi R_{a3}$-3 $\lambda$.Cos $(\alpha_{a4})$/ 2 $\pi R_{a4}$.}

D={Cos $(\alpha_{b1})$/ 2 $\pi R_{b1}$-½.Cos $(\alpha_{b2})$/ 2 $\pi R_{b2}$-½.Cos $(\alpha_{b3})$/ 2 $\pi R_{b3}$}

E={-√3/2.Cos $(\alpha_{b2})$/ 2 $\pi R_{b2}$+√3/2.Cos $(\alpha_{b3})$/ 2 $\pi R_{b3}$}

F={Cos $(\alpha_{b1})$/ 2 $\pi R_{b1}$+Cos $(\alpha_{b2})$/ 2 $\pi R_{b2}$+Cos $(\alpha_{b3})$/ 2 $\pi R_{b3}$-3 $\lambda$.Cos $(\alpha_{b4})$/ 2 $\pi R_{b4}$.}

G={Cos $(\alpha_{c1})$/ 2 $\pi R_{c1}$-½.Cos $(\alpha_{c2})$/ 2 $\pi R_{c2}$-½.Cos $(\alpha_{c3})$/ 2 $\pi R_{c3}$}

H={-√3/2.Cos $(\alpha_{c2})$/ 2 $\pi R_{c2}$+√3/2.Cos $(\alpha_{c3})$/ 2 $\pi R_{c3}$}

I={Cos $(\alpha_{c1})$/ 2 $\pi R_{c1}$+Cos $(\alpha_{c2})$/ 2 $\pi R_{c2}$+Cos $(\alpha_{c3})$/ 2 $\pi R_{c3}$-3 $\lambda$.Cos $(\alpha_{c4})$/ 2 $\pi R_{c4}$.}

Invert the 3×3 matrix in the above terms to derive the geometric factors:

$\Delta$=A. (E.I−F.H)+B. (F.G−D.I)+C. (D.H−E.G)

$\Delta_{1a}$=(E.I−F.H) / $\Delta$ $\Delta_{1b}$=(H.C−B.I) / $\Delta$ $\Delta_{1c}$=(B.F−C.E) / $\Delta$ $\Delta_{2a}$=(F.G−D.I) / $\Delta$ $\Delta_{2b}$=(A.I−C.G) / $\Delta$ $\Delta_{2c}$=(C.D−A.F) / $\Delta$ $\Delta_{3a}$=(D.H−E.G) / $\Delta$ $\Delta_{3b}$=(B.G−A.H) / $\Delta$ $\Delta_{3c}$=(A.E−B.D) / $\Delta$ These geometric calculations are only performed at instrument set up or if the instrument is moved, e.g. in the case of a mobile unit.

Instantaneous Values:

Using coil readings $H_a(t)$, $H_b(t)$ and $H_c(t)$ transform the readings to eliminate the geometry:

$h_1(t) = \Delta_{1a} \cdot H_a(t) + \Delta_{1b} \cdot H_b(t) + \Delta_{1c} \cdot H_c(t)$ $h_2(t) = \Delta_{2a} \cdot H_a(t) + \Delta_{2b} \cdot H_b(t) + \Delta_{2c} \cdot H_c(t)$ $h_3(t) = \Delta_{3a} \cdot H_a(t) + \Delta_{3b} \cdot H_b(t) + \Delta_{3c} \cdot H_c(t)$ $h_{12}(t) = h_1(t) \cdot h_2(t)$ $h_{13}(t) = h_1(t) \cdot h_3(t)$ $h_{23}(t) = h_2(t) \cdot h_3(t)$ Derive rms values for: $H_1$, $H_2$, $h_3$, $h_{12}$, $H_{23}$ and $h_{23}$, i.e. $h_1 = \sqrt{[(\Sigma_1^N h_1^2(t)0/ N]}$, etc.

Sequence Currents:

Using $h_1$, $H_2$, $h_3$, $h_{12}$, $h_{23}$ and $h_{23}$ derive the sequence values:

$\chi = (h_1^2 + H_2^2) / 2$
$\delta = \sqrt{[(h_1^2 - h_2^2)_2 / 4 + h_{12}^2]}$
$I_+ = \frac{1}{2}\{\sqrt{[\chi+\delta]} + \sqrt{[\chi-\delta]}\}$
$I_- = \frac{1}{2}\{\sqrt{[\chi+\delta]} - \sqrt{[\chi-\delta]}\}$
$I0 = h_3$
$\sin \theta_- = h_{12} / (2 . I_+ I_-)$
$\cos \theta_- = (h_1^2) / (4 . I_+ I_-)$
$\epsilon = h_{13} / (h_1 . h_3)$
$\gamma = h_{23} / (h_2 . h_3)$
$W = (I_+ + I_- \cos \theta_-) / h_1$
$X = I_{31} \sin (\theta_-) / h_1$
$Y = (I_+ - I_- \cos \theta_-) / h_2$
$Z = -I_- \sin (\theta_-) / h_2$
$\sin (\theta_0) = (Z . \epsilon + W . \gamma) / (W . Y + X . Z)$
$\cos (\theta_0) = (Y . \epsilon - X . \gamma) / (W . Y + X . Z)$ Wire Currents:

Using $I_+$, $I_-$, $I_0$, $\sin \theta_-$, $\cos \theta_-$, $\sin (\theta_0)$ and $\cos (\theta_0)$ derive the individual wire currents:

$I_R = \sqrt{[(I_+ + L \cos (\theta_-) + I_0 \cos (\theta_0))^2 + (I_- \sin (\theta_-) + I_0 \sin (\theta_0))^2]}$ $I_Y = \sqrt{[(I_+ + L(-\frac{1}{2}\cos(\theta_-) + \sqrt{3}/2 . \sin(\theta_-)) + I_0(-\frac{1}{2}\cos(\theta_0) - \sqrt{3}/2 . \sin(\theta_0)))^2 + (I_-(-\frac{1}{2}\sin(\theta_-) - \sqrt{3}/2 . \cos(\theta_-)) + I_0(-\frac{1}{2}\sin(\theta_0) + \sqrt{3}/2 . \cos(\theta_0)))^2]}$ $I_B = \sqrt{[(I_+ + I_-(-\frac{1}{2}\cos(\theta_-) - \sqrt{3}/2 . \sin(\theta_-)) + I_0(-\frac{1}{2}\cos(\theta_0) + \sqrt{3}/2 . \sin(\theta_0)))^2 + (I_-(-\frac{1}{2}\sin(\theta_-) + \sqrt{3}/2 . \cos(\theta_-)) + I_0(-\frac{1}{2}\sin(\theta_0) - \sqrt{3}/2 . \cos(\theta_0)))^2]}$ $I_N = 3 \lambda I_0$

What is claimed is:

1. An apparatus for remotely sensing the currents flowing in a set of substantially parallel conductors carrying N independent AC currents, the apparatus comprising a portable housing containing N magnetic field senors each positioned at a known location and orientation in the housing to take mutually independent measurements of the magnetic field generated by the conductors and provide corresponding sensor signals, and processing means for deriving further signals respectively corresponding to the conductor currents, the processing means receiving inputs defining location and orientation of the housing relative to each conductor, and the further signals being derived by the processing means based upon the sensor signals and the location and angular orientation of each sensor relative to each conductor as determined by the known location and orientation of each sensor in the housing and the received inputs.

2. An apparatus as claimed in claim 1, wherein the processing means includes means for deriving the harmonic components of the further signals, adjusting the amplitudes of the harmonic components to reduce any distortion produced by said harmonic components in the sensors, and recombining the adjusted frequency components with the fundamental frequency components to produce said further signals with reduced distortion.

3. An apparatus as claimed in claim 2, wherein the means for deriving harmonic frequency components of the sensor signals comprises Fourier analysis means.

4. An apparatus as claimed in claim 3 wherein said apparatus is adapted to remotely sense the currents flowing in an overhead power line comprising four wires carrying three independent AC currents, the apparatus having three magnetic field sensors.

5. An apparatus as claimed in claim 4 wherein the axes of two of the sensors are substantially parallel to one another and the axis of the third sensor is substantially perpendicular to the axes of the first two sensors.

6. An apparatus as claimed in claim 3 wherein the magnetic field sensors are coils.

7. An apparatus as claimed in claim 2 wherein said apparatus is adapted to remotely sense the currents flowing in an overhead power line comprising four wires carrying three independent AC currents, the apparatus having three magnetic field sensors.

8. An apparatus as claimed in claim 7 wherein the axes of two of the sensors are substantially parallel to one another and the axis of the third sensor is substantially perpendicular to the axes of the first two sensors.

9. An apparatus as claimed in claim 2 wherein the magnetic field sensors are coils.

10. An apparatus as claimed in claim 1 wherein said apparatus is adapted to remotely sense the currents flowing in an overhead power line comprising four wires carrying three independent AC currents, the apparatus having three magnetic field sensors.

11. An apparatus as claimed in claim 10, wherein the axes of two of the sensors are substantially parallel to one another and the axes of the third sensor is substantially perpendicular to the axes of the first two sensors.

12. An apparatus as claimed in claim 10 wherein the magnetic field sensors are coils.

13. An apparatus as claimed in claim 1, wherein the magnetite field sensors are coils.

14. An apparatus as claimed in claim 1 wherein the axes of two of the sensors are substantially parallel to one another and the axis of the third sensor is substantially perpendicular to the axes of the first two sensors.

15. A method for remotely seizing the currents flowing in a set of substantially parallel conductors carrying N independent AC currents, the method comprising mounting a portable housing in a fixed position relative to the conductors, the housing containing N magnetic field sensors each positioned at a known location and orientation in the housing to take mutually independent measurements of the magnetic field generated by the conductors and provide corresponding signals, measuring location and orientation of the housing relative to each conductor, providing the measured location and orientation of the housing relative to each conductor as inputs to a processing means, and using the processing means to derive and further signals, respectively corresponding to the conductor currents, based upon the sensor signals and the location and angular orientation of each sensor relative to each conductor as determined by the known location and orientation of each sensor in the housing and the provided inputs.

* * * * *

UNITED STATES PATENT AND TRADEMARK OFFICE
CERTIFICATE OF CORRECTION

PATENT NO. : 6,727,682 B1
APPLICATION NO. : 09/831544
DATED : April 27, 2004
INVENTOR(S) : Noel Patrick Tobin It is certified that error appears in the above-identified patent and that said Letters Patent is hereby corrected as shown below:

Column 1
Line 7, "currants" should be --currents--.
Lines 10-13, Delete "This invention relates to an apparatus and method for remotely sensing the alternating currents (AC) in a set of substantially parallel conductors from the magnetic fields generated by these currents in the vicinity of the conductors".
Line 18, "se" should be --set--.
Line 20, "crrents" should be --currents--.
Line 23, "fews" should be --means--.

Column 4
Line 61, "arms" should be --rms--.

Column 11
Line 4, "commas" should be --comms--.

Column 17
Line 41, Claim 1, "senors" should be --sensors--.

Column 18
Line 33, Claim 11, "axes" should be --axis---.
Line 38, Claim 13, "magnetite" should be --magnetic--.
Line 43, Claim 15, "seizing" should be --sensing--.
Line 55, Claim 15, Delete "and" after "derive".

Signed and Sealed this

Third Day of March, 2009

JOHN DOLL
*Acting Director of the United States Patent and Trademark Office*